United States Patent [19]
de Poorter et al.

[11] Patent Number: 5,093,577
[45] Date of Patent: Mar. 3, 1992

[54] CONTAMINATION MONITOR FOR MEASURING A DEGREE OF CONTAMINATION IN AN EVACUATABLE CHARGED PARTICLE BEAM SYSTEM

[75] Inventors: Johannes A. de Poorter; Johannes F. C. M. Verhoeven, both of Eindhoven, Netherlands

[73] Assignee: U.S. Philips Corporation, New York, N.Y.

[21] Appl. No.: 610,599

[22] Filed: Nov. 8, 1990

[30] Foreign Application Priority Data

Nov. 17, 1989 [NL] Netherlands .......................... 8902843

[51] Int. Cl.$^5$ ............................................ H01J 37/26
[52] U.S. Cl. ............................. 250/397; 250/398; 250/311
[58] Field of Search ................ 250/397, 305, 310, 311, 250/440.1, 398

[56] References Cited

U.S. PATENT DOCUMENTS

| | | | |
|---|---|---|---|
| 3,778,621 | 12/1973 | Mikajiri | 250/311 |
| 3,872,305 | 3/1975 | Koike | 250/311 |
| 4,340,815 | 7/1982 | Franks | 250/311 |
| 4,547,669 | 10/1985 | Nakagawa et al. | 250/397 |
| 4,890,309 | 12/1989 | Smith et al. | 250/505.1 |

FOREIGN PATENT DOCUMENTS 58-133748 8/1983 Japan .

OTHER PUBLICATIONS

Scanning Electron Microscopy/1973 (Part I) "Contamination in the SEM", W. R. Bottoms, pp. 181-188.
Scanning Electron Microscopy/1971 (Part I) "Reduction of Carbon Contamination in the SEM", Brandis et al, pp. 505-510.

*Primary Examiner*—Jack I. Berman
*Assistant Examiner*—Kiet T. Nguyen
*Attorney, Agent, or Firm*—William L. Botjer

[57] ABSTRACT

A degree of contamination can be measured in a charged particle beam system by means of a contamination monitor which is provided with a carrier having an aperture for transmitting a charged particle beam and a membrane which is connected to the carrier and which covers the aperture. The thickness of a contamination layer deposited on the membrane can be determined by measurement of a decrease of the transmission of the membrane as the contamination increases. The accuracy of measurement is enhanced by selecting a central portion of the particle beam transmitted by the membrane.

11 Claims, 2 Drawing Sheets

CONTAMINATION MONITOR FOR MEASURING A DEGREE OF CONTAMINATION IN AN EVACUATABLE CHARGED PARTICLE BEAM SYSTEM

BACKGROUND OF THE INVENTION

The invention relates to a contamination monitor for measuring a degree of contamination in an evacuatable charged particle beam system, comprising a carrier with an aperture for transmitting a charged particle beam in a beam propagation direction.

A contamination monitor of this kind is known from W. R. Bottoms "Contamination in the SEM", Scanning Electron Microscopy/1973, Proceedings of the Sixth Annual Scanning Electron Microscope Symposium, pp. 181-188.

The cited article describes a measuring method where the contamination monitor in a scanning electron microscope (SEM) comprises a carbon film with an aperture. The carbon film with the aperture is scanned by an electron beam and an enlarged image of the aperture is displayed on a television monitor. During irradiation of the carbon film by the electron beam, the aperture is clogged due to beam-induced polymerization of hydrocarbon molecules. These hydrocarbon molecules are present in an evacuatable charged particle beam system due to oil from vacuum pumps, vacuum sealing materials, materials present on the walls of the system, or specimens studied in the beam particle system. A rate of contamination can be measured by determining the decrease of an aperture diameter. A chemical composition of the contamination can be determined by way of Auger measurements. However, a quantitive measure of the contamination is not obtained in this manner.

SUMMARY OF THE INVENTION

It is inter alia an object of the invention to provide a contamination monitor enabling a quantitive measure of an amount of contamination in a charged beam particle system to be obtained in a simple manner. To achieve this, a contamination monitor in accordance with the invention is characterized in that a membrane which covers the aperture and on which a contamination can be deposited is connected to the carrier.

Because the contamination is deposited on the membrane, the thickness of a contamination layer can be simply measured by measuring the attenuation of the charged particle beam upon its passage through the contaminated membrane. The angular distribution of the propagation direction of a non-diverging charged particle beam dispersed by the contamination layer is widened after irradiation of the membrane. When only a central portion of the transmitted charged particle beam is detected by a detector and the attenuation of this central portion is determined, a measure of the thickness of the contamination layer is obtained. A ratio of an intensity of the charged particle beam incident on the membrane to the transmitted charged particle beam decreases exponentially as a function of the thickness of the contamination layer, an exponent being dependent on the material of the contamination layer.

It is to be noted that from E. K. Brandis c.s. "Reduction of carbon contamination in the SEM"; Scanning Electron Microscopy/1971, Proceedings of the Fourth Annual Scanning Electron Microscopy Symposium, pp. 505-510, it is known to measure the thickness of a contamination layer by contaminating a substrate by irradiation by means of an electron beam and by geometrically measuring the thickness from an enlarged image of the substrate. However, this method does not utilize a membrane on which the contamination is deposited and it is also necessary to form a specimen image before the layer thickness can be measured. As a result of the use of an aperture in a carrier, which aperture is covered by a sufficiently thin membrane which has no noticeable diverging effect on a propagation direction of a charged particle beam, a thickness of the contamination layer in the order of magnitude of 1 nm can be determined by measurement of the transmission of the charged particle beam.

An embodiment of a contamination monitor in accordance with the invention is characterized in that the contamination monitor also comprises a diaphragm which cooperates with the aperture in order to limit a charged particle beam transmitted by the membrane.

When a diaphragm having a diameter of, for example 200 $\mu$m is arranged underneath the carrier, only a central portion of the transmitted particle beam will reach the detector. A sensitivity of the measurement of the beam attenuation is enhanced when the transmitted particles are detected in a comparatively narrow zone around the centre of the angular distribution of the propagation direction of the transmitted particle beam.

A further preferred embodiment of a contamination monitor in accordance with the invention is characterized in that the contamination monitor comprises current-conductive shielding means for intercepting charged particles which are scattered by the membrane and which have a direction with a component which opposes the beam propagation direction.

A shield intercepts particles backscattered by the membrane, so that these particles no longer influence a signal to be detected. The signal-to-noise ratio of a detection signal is thus enhanced.

A further embodiment of a contamination monitor in accordance with the invention is characterized in that the contamination monitor comprises a reflection member having a beam reflection face extending transversely of the beam propagation direction.

The beam reflection face reflects particles transmitted by the membrane to the detector. Thus, the detector can be mounted adjacent the contamination monitor instead of alongside a beam propagation direction.

A further preferred embodiment of a contamination monitor in accordance with the invention is characterized in that the reflection member comprises coupling means for detachable coupling to an object holder of the charged particle beam system.

As a result of the detachable coupling of the reflection member to the object holder, the contamination monitor can be readily exchanged with an object carrier in the charged particle beam system.

Another preferred embodiment yet of a contamination monitor in accordance with the invention is characterized in that the contamination monitor comprises a current-conductive member which includes a portion which extends as far as the beam reflection face and which has a tubular shape, the shielding means comprising a tube wall which is provided with an exit aperture, the carrier being enclosed by the tubular portion.

When the carrier with the membrane is arranged within the tubular portion, the detector is suitably shielded against backscattered charged particles intercepted by the tube walls. The non-tubular portion of the current-conductive member serves as a reflection face and reflects the transmitted charged particles to the detector via the exit aperture. Because of its simple construction, the contamination monitor can be readily manufactured and is, therefore, comparatively inexpensive.

A further preferred embodiment of a contamination monitor in accordance with the invention is characterized in that the contamination monitor comprises at least one carrier and shielding means in the form of a drum which is mounted on the reflection member and which encloses at least said one carrier, in an upper face of said drum there being provided an entrance aperture which cooperates with the aperture in said at least one carrier, an exit aperture which serves as the diaphragm being provided in a lower face.

A drum comprising entrance and exit apertures can comprise a number of carriers. The edges of the exit apertures then serve as diaphragms. When the reflection member is provided with a bore, an amount of charge intercepted in the bore can be measured. To this end, the charged particle beam is deflected so that it enters the drum via the entrance aperture which cooperates with the bore, and leaves the drum via the exit aperture cooperating with the bore.

A further embodiment of a contamination monitor in accordance with the invention is characterized in that the beam reflection face contains gold.

When a heavy metal is used to construct the reflection member or when this member is covered with a heavy metal, a large fraction of the charged particles incident on the reflection body will be reflected to the detector. The signal-to-noise ratio of the detection signal is thus enhanced.

A further embodiment of a contamination monitor in accordance with the invention is characterized in that the carrier contains Si at the area of attachment of the membrane, the membrane containing $Si_3N_4$.

Si is a particularly suitable material for the carrier with an attached $Si_3N_4$ membrane. These materials are known from the semiconductor industry and it has been found that they can be surprisingly effectively used in a contamination monitor in accordance with the invention. For suitable sensitivity of the contamination monitor the membrane has a thickness of approximately 10 nm with and aperture diameter of 40 $\mu$m.

BRIEF DESCRIPTION OF THE DRAWINGS

Some embodiments of a contamination monitor in accordance with the invention will be described in detail hereinafter with reference to the accompanying drawing. Therein.

DETAILED DESCRIPTION OF THE PREFERRED EMBODIMENTS

Figure 1:
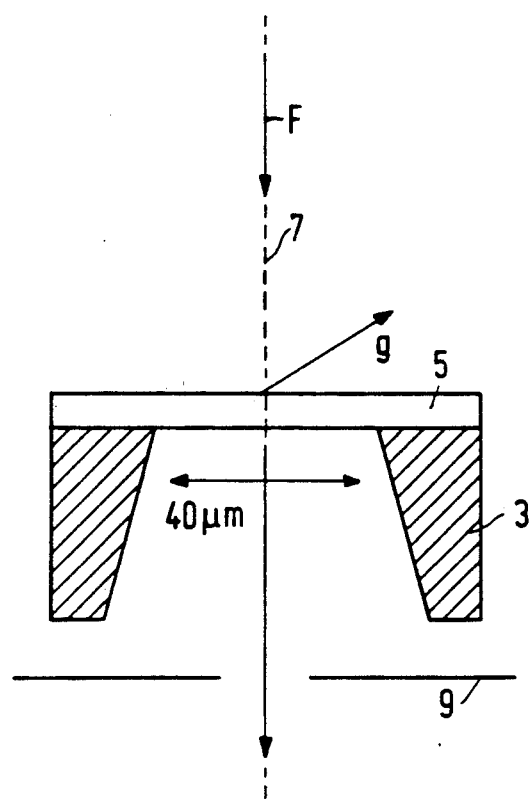
FIG. 1 is a lateral sectional view of a carrier with a membrane in accordance with the invention, FIGS. 2a and 2b diagrammatically show an angular distribution of the propagation direction of a charged particle beam before and after passage through the membrane, respectively.
Figure 2A:
Figure 2B:
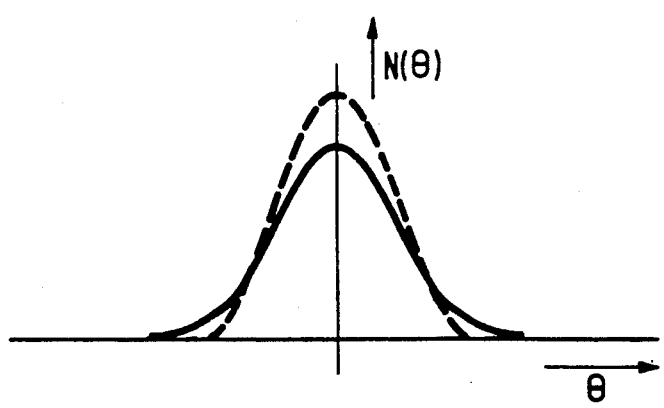

FIG. 1 shows a carrier 3, for example, an Si carrier having a thickness of 0.4 mm and a transverse dimension of 2 mm and comprising a square aperture having a side of 40 $\mu$m and a membrane 5 which spans the aperture. A thickness of the membrane 5, containing for example $Si_3N_4$, amounts to, for example 10 nm. A charged particle beam 7, for example an electron beam propagating in a beam propagation direction F can pass the membrane 5 without experiencing noticeable attenuation. FIG. 2a shows an angular distribution of the propagation direction of a parallel beam before the beam is incident on the membrane 5. The interrupted line in FIG. 2b represents the angular distribution of the propagation direction of this beam after having passed the membrane 5. A slight beam spread occurs. When a contamination layer is present on the membrane 5, for example a layer of carbon, the angular distribution of the propagation direction of the transmitted particle beam will be as represented by the non-interrupted line in FIG. 2b. A larger beam spread occurs and the value decreases in the central part of the angular distribution; the angular distribution assumes a higher value for larger angles. The attenuation of the central portion of the angular distribution is exponentially dependent on a thickness of the contamination layer, the density of the material of the contamination layer, and a scatter cross-section of this material. The form of the angular distribution is determined, notably for large thicknesses of the contamination layer, by multiple scattering of the charged particles and does not exhibit a simple dependency on the thickness of the contamination layer. In order to limit the effect thereof on the accuracy of measurement of the thickness of the contamination layer, it is desirable to detect only the central portion of the angular distribution. To this end, the charged particle beam is shaped by means of a diaphragm 9.

Figure 3:
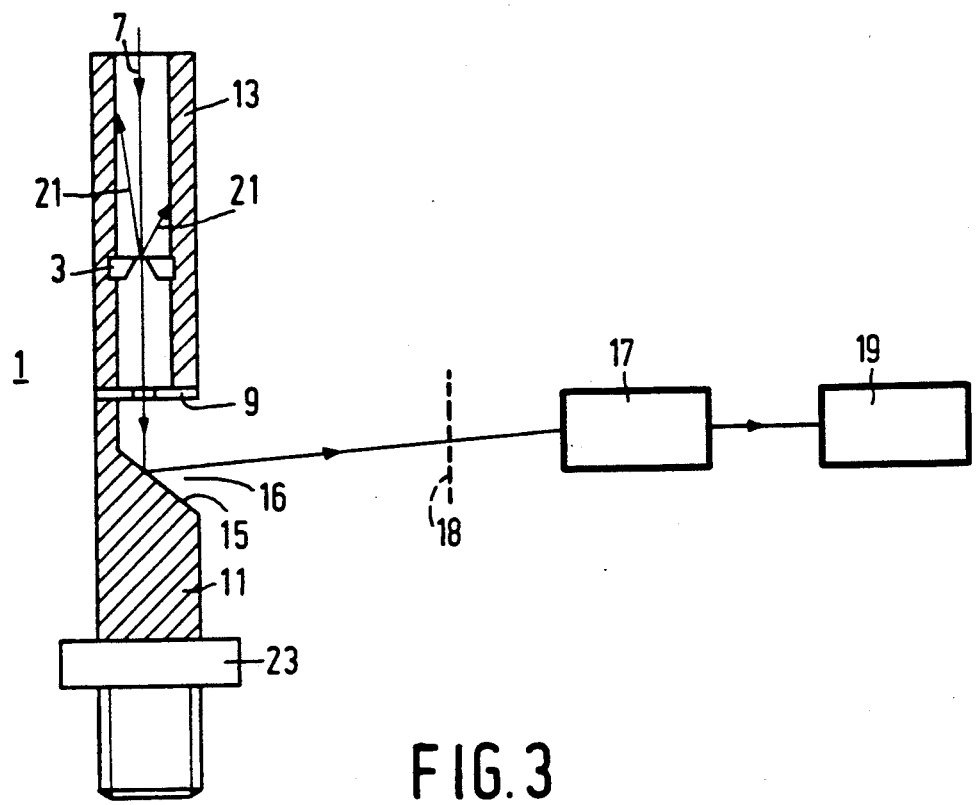
FIG. 3 is a lateral sectional view of an embodiment of a contamination monitor in accordance with the invention.

FIG. 3 shows an embodiment of a contamination monitor 1 which comprises a current-conductive reflection member 11 having a tubular portion 13 with an external diameter of, for example 5 mm and an internal diameter of 3 mm. The tubular portion 13 encloses the carrier 3. After having passed the membrane 5, the charged particle beam 7 is reflected by a beam reflection face 15 and emerges from the contamination monitor via an exit aperture 16. An extraction grid 18 accelerates the transmitted particle beam to a detector 17 which generates a detection signal proportional to the quantity of particles detected. The detection signal is displayed by way of a display unit 19, for example a voltmeter or an oscilloscope. The aperture 9 is formed by a ring which is connected to the tubular portion 13 or is integral with the tubular portion 13. The aperture 9 is situated, for example at a distance of 2 mm from the membrane 5 and comprises an aperture having a diameter of, for example 200 $\mu$m. The tube wall of the tubular portion 13 situated over the membrane 5 constitutes a shield which intercepts charged particles which are scattered by the membrane in a direction opposing the propagation direction F, the detector 17 thus being shielded against these particles. As a result, only the particles transmitted by the membrane 5 will reach the detector 17 so that a signal-to-noise ratio of the detection signal is enhanced. The contamination monitor 1 comprises fixing means 23 in the form of, for example a thread mating with a thread in an object holder of a charged particle beam system. The contamination monitor can thus simply be exchanged with an object carrier of the charged particle beam system. The fixing means may also comprise a bayonet connection.

Figure 4:
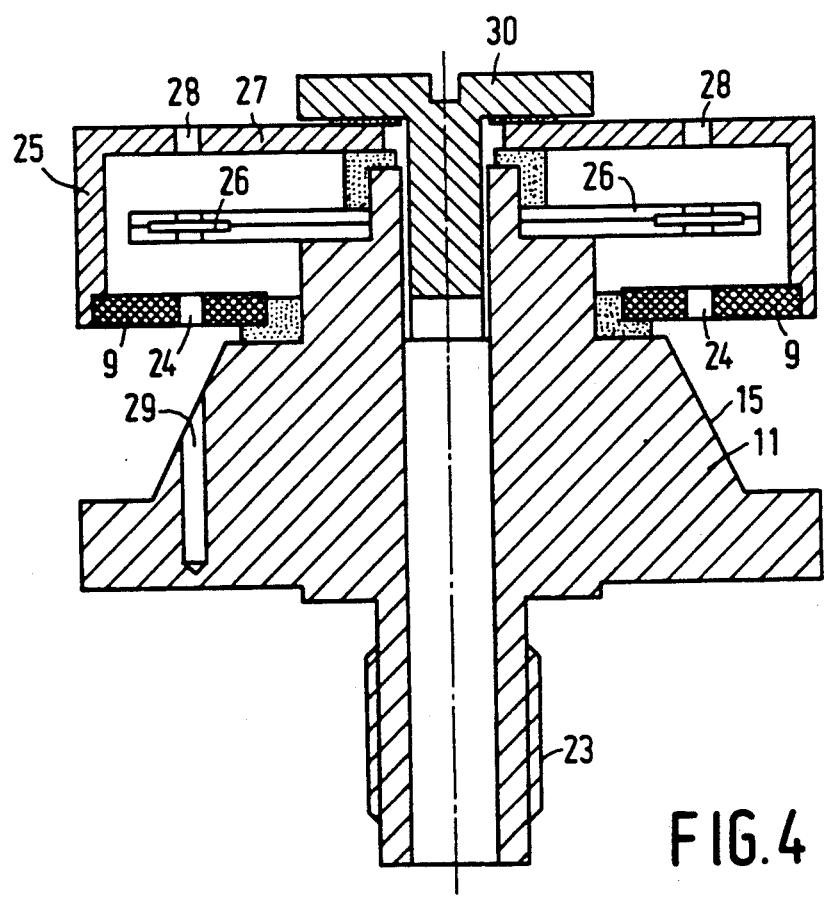
FIG. 4 is a lateral sectional view of a further embodiment of a contamination monitor in accordance with the invention.

FIG. 4 is a lateral sectional view of a drum 25 enclosing two carriers 26. The drum 25 is mounted on the reflection member 11 and comprises an upper face 27 provided with entrance apertures 28 which have a centre line in common with the aperture in the carriers 26. A lower face of the drum 25 is provided with a beam-limiting exit aperture 24 wherethrough the particle beam 7 can emerge from the drum so as to be incident on the reflection face 15 or in a bore 29 provided in the reflection member 11. Via the reflection face 15, the transmitted particles are again guided to the detector 17 (FIG. 3). When the particle beam is incident in the bore 29, a beam current can be measured by measurement of the charge accumulated on the reflection member 11. The contamination monitor should then be electrically insulated with respect to the charged particle beam system. The drum 25 can be detached from the reflection member by loosening a screw 30, the diaphragms 9 retaining their position. Subsequently, the carriers 3 can be replaced by carriers with a membrane without contamination layer.

We claim:

1. A contamination monitor for measuring a degree of contamination in an evacuatable charged particle beam system, comprising a carrier with an aperture for transmitting a charged particle beam in a beam propagation direction, characterized in that a membrane which covers the aperture and on which a contamination is deposited, is connected to the carrier.

2. A contamination monitor as claimed in claim 1, characterized in that the contamination monitor also comprises a diaphragm which cooperates with the aperture in order to limit a charged particle beam transmitted by the membrane.

3. A contamination monitor as claimed in claim 1, characterized in that the contamination monitor comprises current-conductive shielding means for intercepting particles which are scattered by the membrane and which have a direction with a component which opposes the beam propagation direction.

4. A contamination monitor as claimed in claim 1, characterized in that the contamination monitor comprises a reflection member having a beam reflection face extending transversely of the beam propagation direction.

5. A contamination monitor as claimed in claim 4, characterized in that the reflection member comprises coupling means for detachable coupling to an object holder of the charged particle beam system.

6. A contamination monitor as claimed in claim 3, characterized in that the contamination monitor comprises a current-conductive member which includes a portion which extends as far as the beam reflection face and which has a tubular shape, the shielding means comprising a tube wall which is provided with an exit aperture, the carrier being enclosed by the tubular portion.

7. A contamination monitor as claimed in claim 2, characterized in that the contamination monitor comprises at least one carrier and shielding means in the form of a drum which is mounted on the reflection member and which encloses at least said one carrier, in an upper face of said drum there being provided an entrance aperture which cooperates with the aperture in said at least one carrier, an exit aperture which serves as the diaphragm being provided in a lower face.

8. A contamination monitor as claimed in claim 7, characterized in that the reflection member is provided with a bore for intercepting the charged particle beam.

9. A contamination monitor as claimed in claim 4, characterized in that the beam reflection face contains gold.

10. A contamination monitor as claimed in claim 1, characterized in that the carrier contains Si at the area of attachment of the membrane, the membrane containing $Si_3N_4$.

11. A contamination monitor as claimed in claim 1, characterized in that the thickness of the membrane is in the order of magnitude of 10 nm.

* * * * *